United States Patent
Hung et al.

(10) Patent No.: US 9,362,382 B1
(45) Date of Patent: Jun. 7, 2016

(54) METHOD FOR FORMING SEMICONDUCTOR DEVICE WITH LOW SEALING LOSS

(71) Applicant: UNITED MICROELECTRONICS CORPORATION, Hsinchu (TW)

(72) Inventors: Yu-Hsiang Hung, Tainan (TW); Yen-Liang Wu, Taipei (TW); Ssu-I Fu, Kaohsiung (TW); Chih-Kai Hsu, Tainan (TW); Jyh-Shyang Jenq, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/542,685

(22) Filed: Nov. 17, 2014

(51) Int. Cl.
| | |
|---|---|
| *H01L 21/311* | (2006.01) |
| *H01L 21/02* | (2006.01) |
| *H01L 29/66* | (2006.01) |
| *H01L 21/033* | (2006.01) |
| *H01L 21/266* | (2006.01) |

(52) U.S. Cl.
CPC ...... *H01L 29/66492* (2013.01); *H01L 21/0214* (2013.01); *H01L 21/0217* (2013.01); *H01L 21/02167* (2013.01); *H01L 21/0335* (2013.01); *H01L 21/0337* (2013.01); *H01L 21/266* (2013.01); *H01L 21/31111* (2013.01); *H01L 21/31116* (2013.01); *H01L 21/31144* (2013.01); *H01L 29/66795* (2013.01)

(58) Field of Classification Search
CPC ..................... H01L 29/66492; H01L 21/0217
USPC .......................................................... 438/702
See application file for complete search history.

(56) References Cited

U.S. PATENT DOCUMENTS

| | | | |
|---|---|---|---|
| 7,652,332 B2 | 1/2010 | Cartier | |
| 2002/0042166 A1* | 4/2002 | Nandakumar | H01L 21/266 438/142 |
| 2002/0047201 A1* | 4/2002 | Suzuki | H01L 21/76802 257/751 |
| 2005/0224880 A1* | 10/2005 | Lee | H01L 29/42392 257/347 |
| 2013/0009251 A1* | 1/2013 | Jain | H01L 21/823807 257/369 |
| 2013/0273702 A1 | 10/2013 | Zheng | |
| 2014/0235064 A1* | 8/2014 | Matsui | H01L 21/31111 438/753 |
| 2015/0126030 A1* | 5/2015 | Yang | H01L 21/76871 438/675 |
| 2015/0179767 A1* | 6/2015 | Wang | H01L 29/66795 257/347 |

* cited by examiner

*Primary Examiner* — Moazzam Hossain
(74) *Attorney, Agent, or Firm* — Ding Yu Tan

(57) ABSTRACT

A method for forming a semiconductor device, includes steps of: providing a substrate; forming a first seal layer over the substrate; forming a second seal layer atop the first seal layer; forming a patterned photoresist layer on the second seal layer; implanting a dopant into the substrate by using the patterned photoresist layer as a mask; executing a first removing process to remove the patterned photoresist layer, wherein the first seal layer has a higher etch rate than that of the second seal layer in the first removing process; and removing the second seal layer after removing the patterned photoresist layer.

15 Claims, 7 Drawing Sheets

METHOD FOR FORMING SEMICONDUCTOR DEVICE WITH LOW SEALING LOSS

FIELD OF THE INVENTION

The invention relates to a manufacture process of a semiconductor device with dopant implanting structure, and more particularly to a Field Effect Transistor (FinFET) manufacturing process.

BACKGROUND OF THE INVENTION

While manufacturing semiconductor devices such as FinFETs having Lightly Doped Drain (LDD) structures, a nitride seal, such as a silicon nitride (SiN) layer, serves as a diffusion barrier to oxygen and prevents contamination during subsequent processing. However, the thickness of the SiN layer may become thinner than desired during a LDD wet cleaning process. It would worsen the performance of the semiconductor device and causes a serious dopant-loss problem, and might cause bump issues after an epitaxial (EPI) forming process.

SUMMARY OF THE INVENTION

An object of the invention is to solve the seal loss issues of a dopant implanting structure as mentioned above.

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

According an embodiment of the invention, a method for forming a semiconductor device includes steps of providing a substrate; forming a first seal layer over the substrate; forming a second seal layer atop the first seal layer; forming a patterned photoresist layer on the second seal layer; implanting a dopant into the substrate by using the patterned photoresist layer as a mask; executing a first removing process to remove the patterned photoresist layer, wherein the first seal layer has a higher etch rate than that of the second seal layer in the first removing process; and removing the second seal layer after removing the patterned photoresist layer.

The etch selectivity of the first seal layer to the second seal layer is greater than 7:1.

The total thickness of the first seal layer and the second seal layer is ranged between 20 Å to 50 Å.

The first seal layer may be made of SiN, SiON, SiCN, or other similar materials.

The second seal layer is a silicon oxide layer, or other layers having high etch selectivity to the first seal layer.

The substrate has a gate structure formed thereon. The first seal layer covers the gate structure.

The step of forming the patterned photoresist layer includes forming a photoresist layer and patterning the photoresist layer by a lithographic process.

The first removing process is a wet etching process, or a dry etching process followed by a wet etching process.

The method further includes steps of forming a patterned hard mask layer on the first seal layer after the second seal layer being removed; forming a recess in the substrate by using the patterned hard mask as a mask; and forming an epitaxial layer into the recess.

According to an embodiment of the invention, the semiconductor device is a FinFET.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

Figure 1:
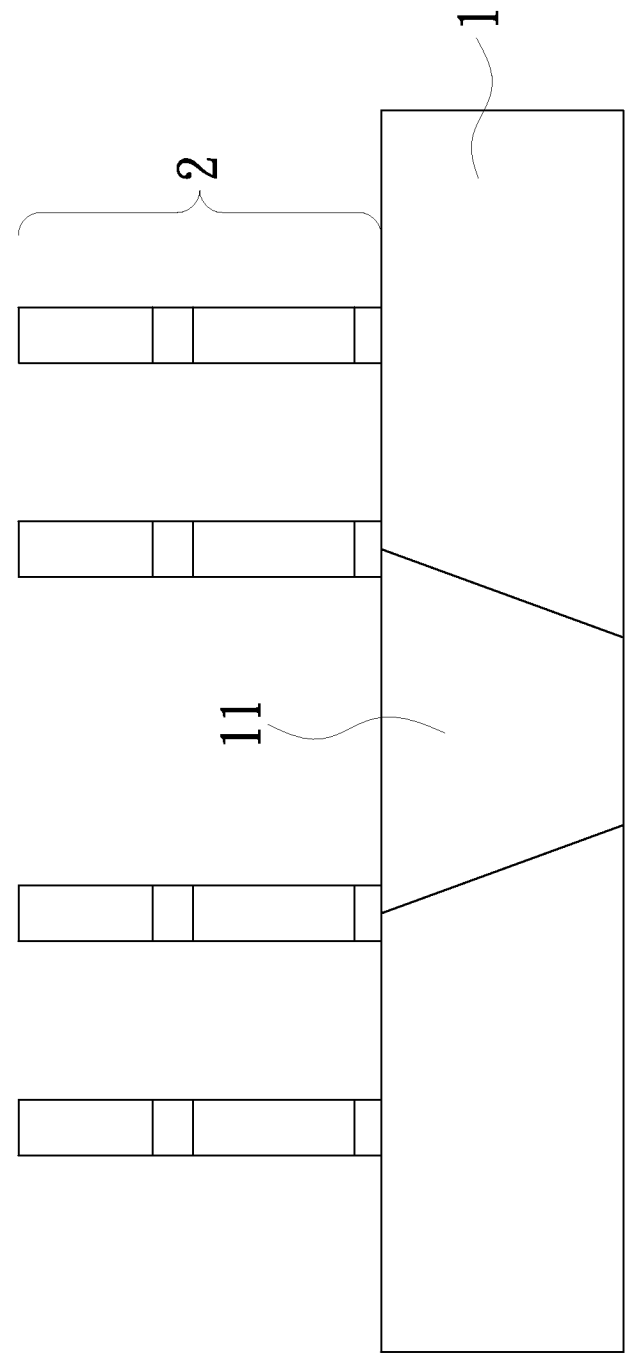
FIG. 1 is a cross-sectional view showing a gate structure formed for a process for forming a FinFET according to an embodiment of the invention.
Figure 2A:
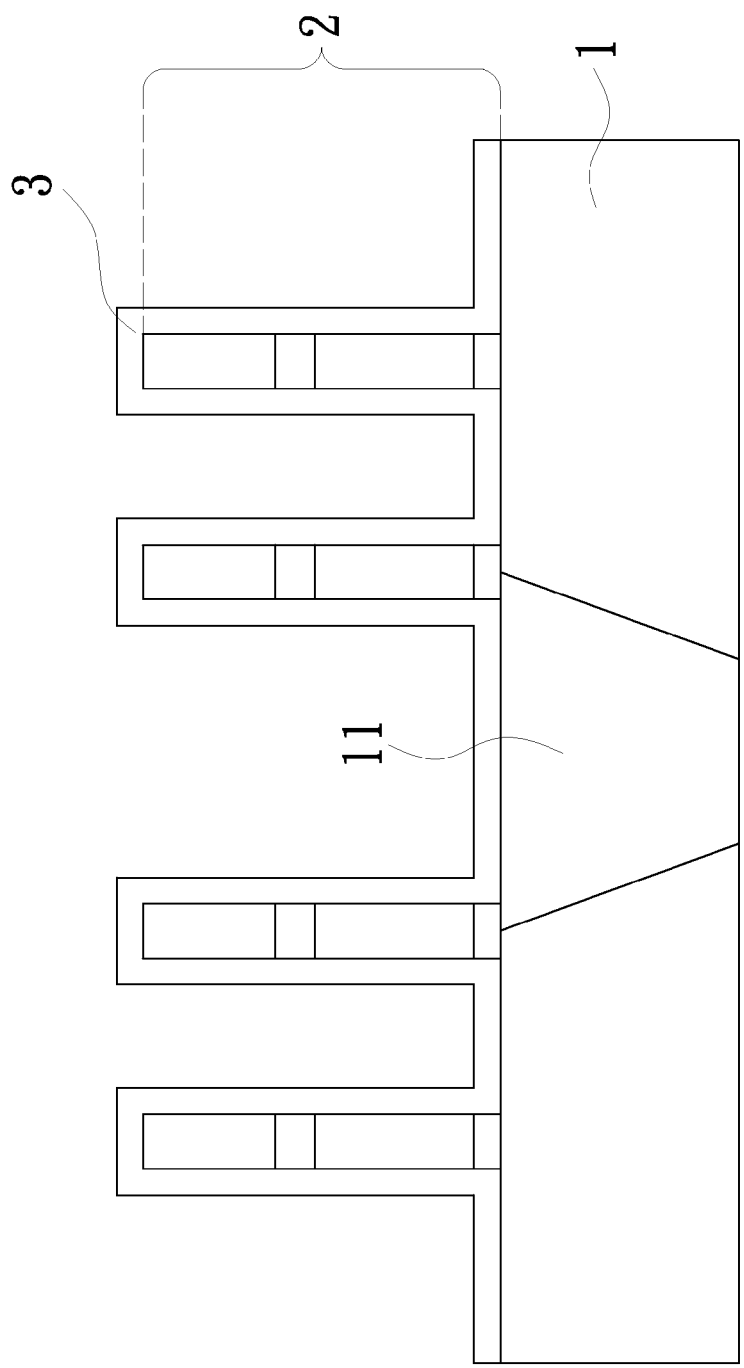
FIGS. 2A and 2B are cross-sectional views showing a first and second seal layers deposited atop of a gate structure according to the embodiment of the invention.
Figure 2B:
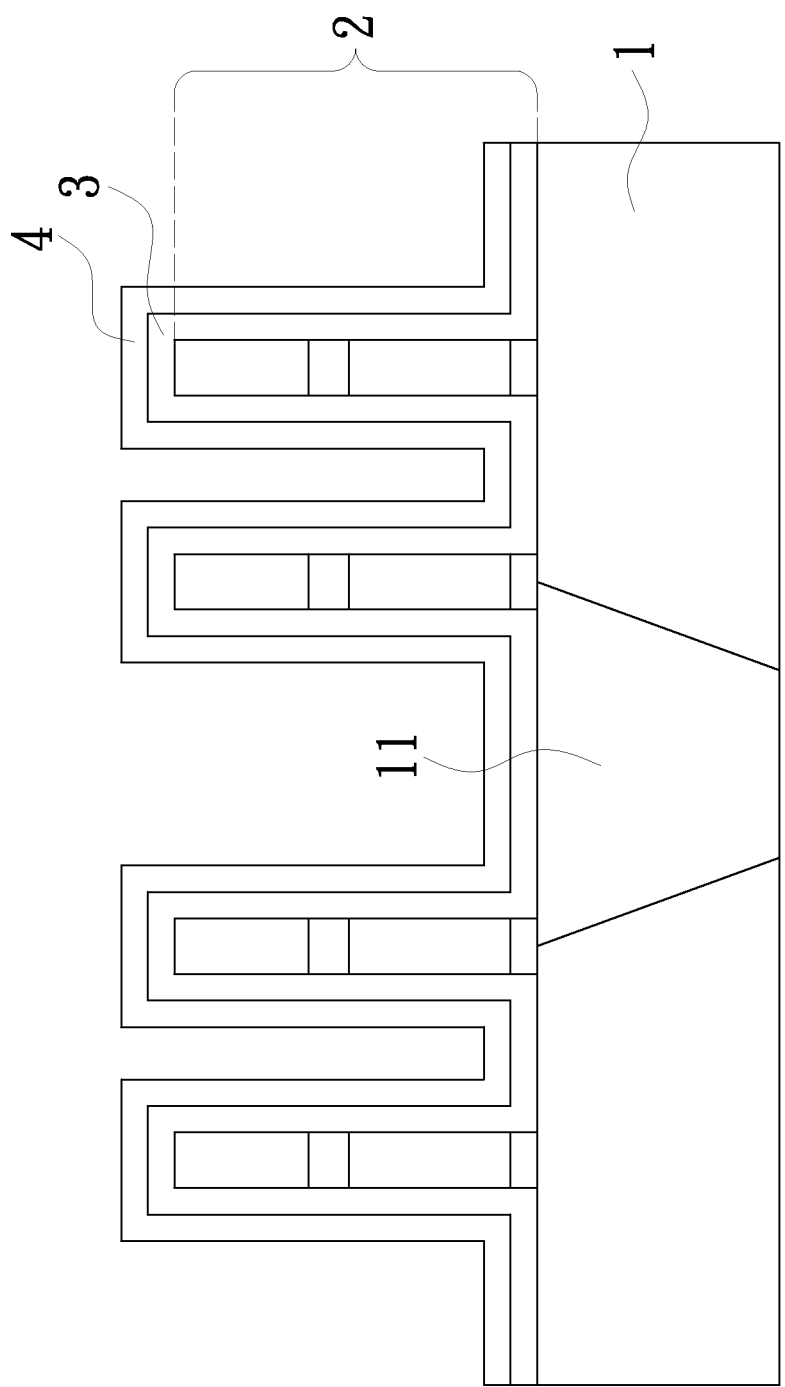
Figure 3:
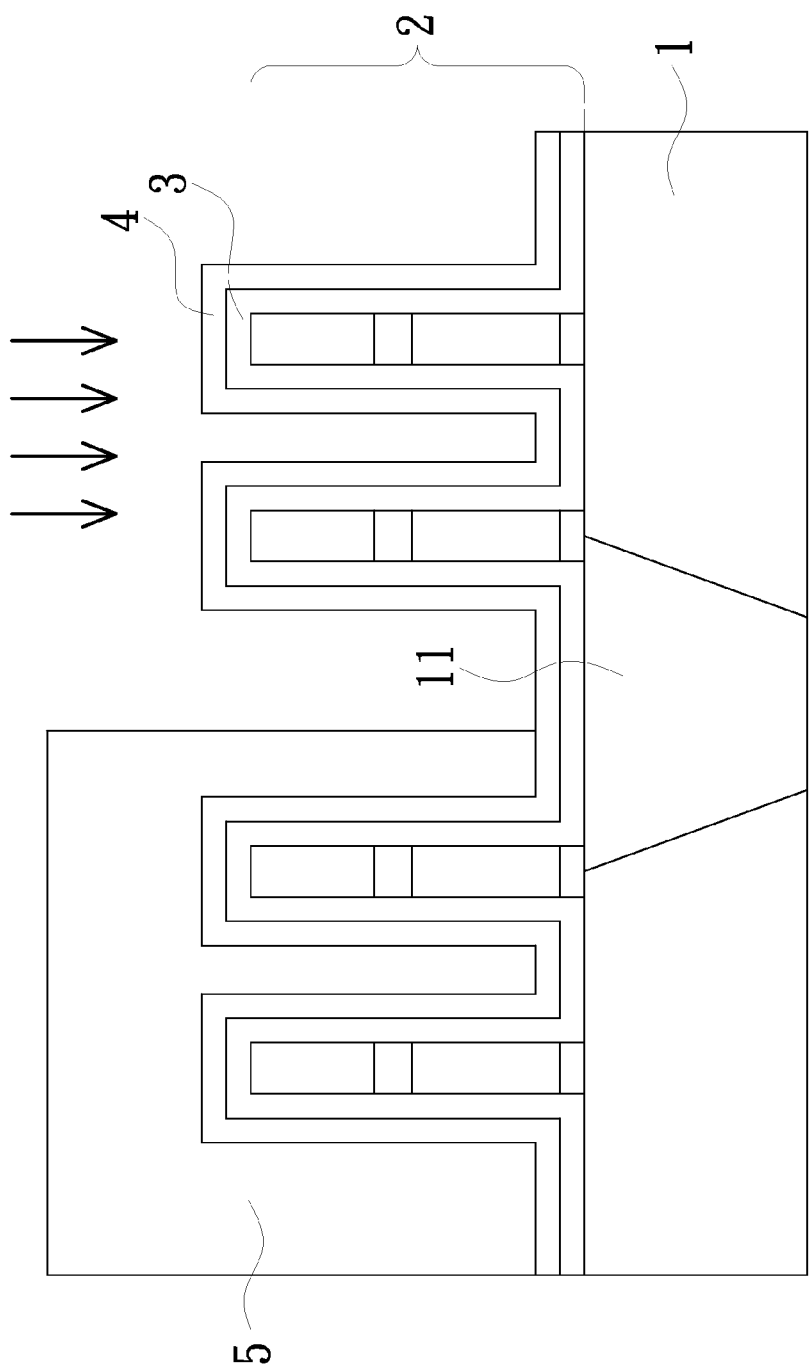
FIG. 3 is a cross-sectional view showing a LDD structure formed according to the embodiment of the invention.

Please refer to FIG. 1, a gate patterning process is executed or performed on a substrate 1 having an isolation structure 11, so that a gate structure 2 is formed. Then, as shown in FIGS. 2A and 2B, a first seal layer 3 is deposited atop the substrate 1 and covers the gate structure 2, and a second seal layer 4 is deposited atop the first seal layer 3. In this embodiment, the first seal layer 3 and the second seal layer 4 are LDD seal layers. To form the LDD structure as shown in FIG. 3, a patterned photoresist layer 5 is formed on the second seal layer 4, and then a dopant is implanted into the substrate 1 by using the patterned photoresist layer 5 as a mask.

Figure 4A:
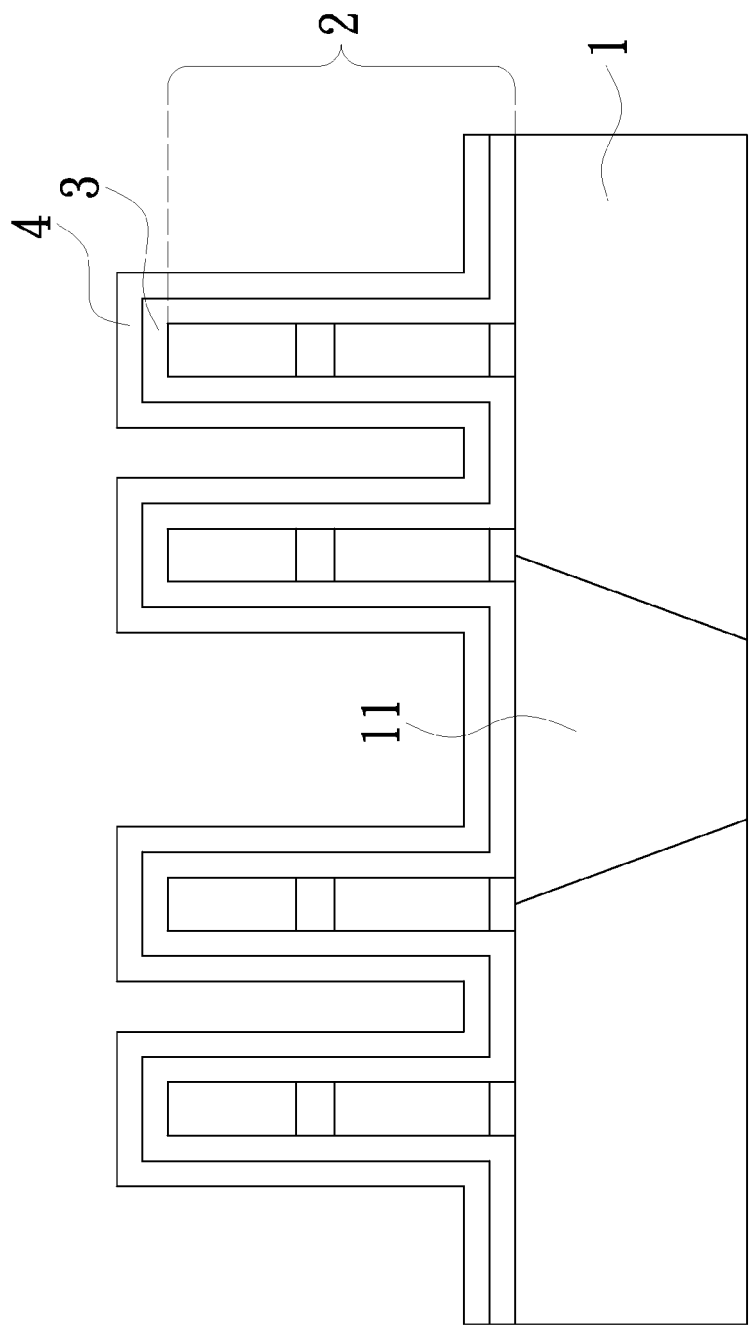
FIGS. 4A and 4B are cross-sectional views of the process for forming the FinFET according to the embodiment of the invention.

A first removing process is then executed to remove the patterned photoresist layer 5. Referring to FIG. 4A, the first removing process might be a dry etching process followed by a wet etching process, or just a wet etching process. In the first removing process, the first seal layer 3 has a higher etch rate than that of the second seal layer 4. In general, the etch selectivity of the first seal layer 3 to the second seal layer 4 is greater than 7:1. The first seal layer 3 may be a nitride layer made of silicon nitride (SiN), silicon oxynitride (SiON), silicon carbonitride (SiCN), or other similar materials. The second seal layer 4 may be an oxide layer, such as, e.g. a silicon oxide layer, or other layers having higher etch selectivities to the first seal layer 3.

In general, the steps of forming the patterned photoresist layer, implanting dopant into the substrate and removing the patterned photoresist layer are repeated for multiple times, so as to form LDD structures in several predetermined regions in the substrate. During the multiple wet cleaning processes, if the seal layer loss happens, the gate structure and the substrate might be damaged.

Figure 4B:
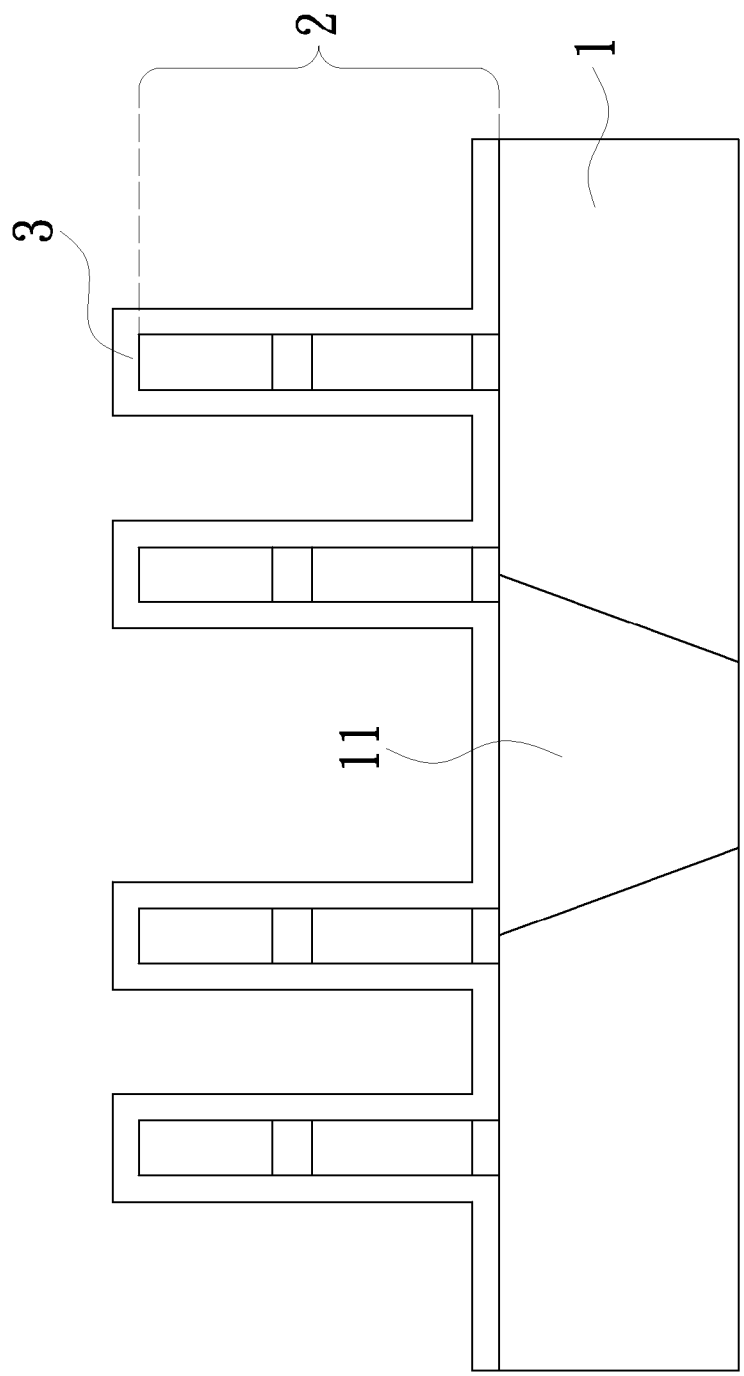

Once the formation of LDD structures in several predetermined regions in the substrate is completed, as shown in FIG. 4B, the second seal layer 4 is then removed after removing the patterned photoresist layer 5. Please note that during removing of the second seal layer 4, another wet etching process is executed for the second seal layer 4, and the first seal layer 3 serves as an etch stop layer. In a preferred embodiment, the second seal layer 4 is completely removed and the first seal layer 3 is remained.

Figure 5:
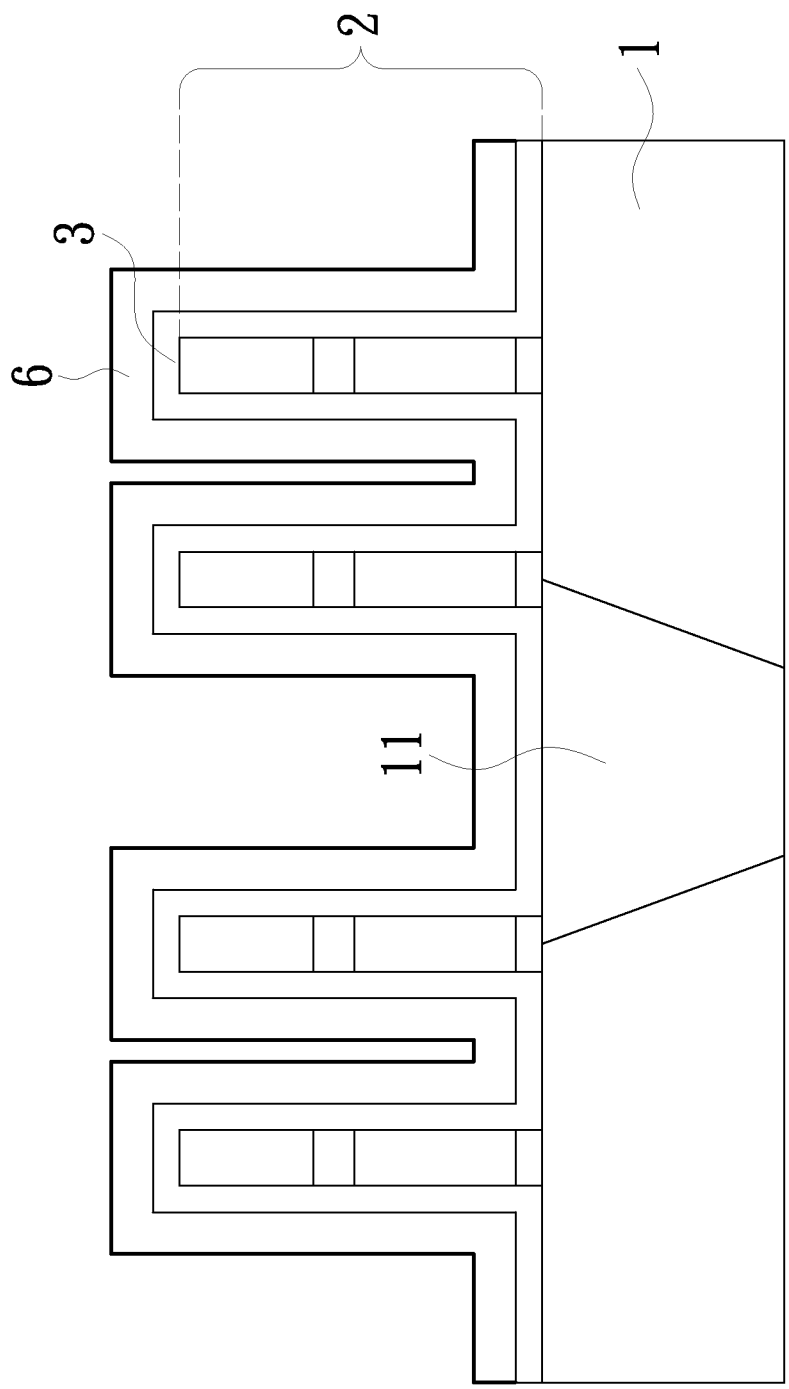
FIG. 5 is a cross-sectional view showing remaining steps for forming the FinFET according to the embodiment of the invention.

FIG. 5 illustrates the remaining steps for forming FinFETs according to the embodiment of the invention. After removing the second seal layer 4, a patterned hard mask layer 6 is formed atop the first seal layer 3. For certain purpose, the patterned hard mask 6 might be constructed by two or more deposition processes. The patterned hard mask 6 may be a nitride layer made of SiN, SiON, SiCN, or other similar materials. In a preferred embodiment, the patterned hard mask 6 and the first seal layer 3 have the same material.

The total thickness of the first seal layer 3 and the second seal layer 4 is ranged between 20 angstrom (Å) to 50 angstrom (Å). While modifying a conventional FinFET manufacturing process by using or adopting the techniques and method of the embodiment of the invention, it is noticeable that to maintain or sustain the performance of the FinFET device, the total thickness of the first seal layer 3 and the patterned hard mask 6 must be kept constant. For example, the first seal layer 3 might have a thickness of 30 Å in a conventional process, while the patterned hard mask 6 is constructed by two deposition processes, and each deposition process provide 60 Å for the thickness of the patterned hard mask 6. Accordingly, the total thickness of the first seal layer 3 and the patterned hard mask 6 is 150 Å. When modifying the conventional process into the method of the invention, the thicknesses of the first seal layer 3, the second seal layer 4, the first and second deposited layers for the patterned hard mask 6 might be 15 Å, 15 Å, 75 Å, and 60 Å, respectively. Since the second seal layer 4 will be removed before the formation of the patterned hard mask 6, the total thickness of the first seal layer 3 and the patterned hard mask 6 is still remained as 150 Å.

A recess (not shown) is then formed in the substrate 1 by using the patterned hard mask 6 as a mask and an epitaxial layer (not shown) is formed into the recess. Depending on the demand of the process, formation of elements (not shown) including additional spacers, source/drain region, epitaxial layer, silicides, and contact etch stop layer and replacement metal gate (RMG) process could be conducted thereafter to complete the fabrication of a metal gate transistor (not shown), and as these processes are well known to those skilled in the art, the details of which are not explained in for the sake of brevity. This completes the fabrication of a semiconductor device according to a preferred embodiment of the present invention.

To sum up, during the formation process of a dopant-implanting structure of a semiconductor device such a FinFET, an extra seal layer, e.g. an oxide layer, is added atop of the original seal layer, e.g. a nitride layer. According to the lower etching rate for the extra seal layer to the original seal layer during the wet clean process, the later (original seal layer) will be protected, and thus solve the LDD seal layer loss issue.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a semiconductor device, comprising steps of:
   providing a substrate;
   forming a first seal layer over the substrate;
   forming a second seal layer atop the first seal layer;
   forming a patterned photoresist layer on the second seal layer;
   implanting a dopant into the substrate by using the patterned photoresist layer as a mask;
   executing a first removing process to remove the patterned photoresist layer,
   wherein the first seal layer has a higher etch rate than that of the second seal layer in the first removing process;
   removing the second seal layer after removing the patterned photoresist layer; and
   forming a patterned hard mask layer on the first seal layer after the second seal layer being removed;
   wherein the semiconductor device is a FinFET.

2. The method according to claim 1, wherein the substrate has a gate structure formed thereon.

3. The method according to claim 2, wherein the first seal layer covers the gate structure.

4. The method according to claim 1, wherein the step of forming the patterned photoresist layer includes forming a photoresist layer and patterning the photoresist layer by a lithographic process.

5. The method according to claim 1, wherein the first removing process is a wet etching process.

6. The method according to claim 1, wherein the first removing process is a dry etching process followed by a wet etching process.

7. The method according to claim 1, wherein the etch selectivity of the first seal layer to the second seal layer is greater than 7:1.

8. The method according to claim 1, wherein the total thickness of the first seal layer and the second seal layer is ranged between 20 angstrom (Å) to 50 angstrom (Å).

9. The method according to claim 1, wherein the first seal layer is a nitride layer.

10. The method according to claim 9, wherein the nitride layer is a SiN layer.

11. The method according to claim 9, wherein the nitride layer is a SiON layer.

12. The method according to claim 9, wherein the nitride layer is a SiCN layer.

13. The method according to claim 1, wherein the second seal layer is an oxide layer.

14. The method according to claim 13, wherein the oxide layer is a silicon oxide layer.

15. The method according to claim 1, wherein the first seal layer is a first LDD seal layer, and the second seal layer is a second LDD seal layer.

* * * * *